United States Patent
Okano (10) Patent No.: US 8,232,940 B2
(45) Date of Patent: Jul. 31, 2012

(54) ORGANIC ELECTROLUMINESCENT DISPLAY DEVICE AND PRODUCTION METHOD THEREOF

(75) Inventor: Kiyoshi Okano, Ibaraki (JP)

(73) Assignee: Sharp Kabushiki Kaisha, Osaka (JP)

( * ) Notice: Subject to any disclaimer, the term of this patent is extended or adjusted under 35 U.S.C. 154(b) by 920 days.

(21) Appl. No.: 12/294,477

(22) PCT Filed: Apr. 13, 2007

(86) PCT No.: PCT/JP2007/058198
§ 371 (c)(1),
(2), (4) Date: Sep. 25, 2008

(87) PCT Pub. No.: WO2007/125768
PCT Pub. Date: Nov. 8, 2007

(65) Prior Publication Data
US 2010/0231490 A1    Sep. 16, 2010

(30) Foreign Application Priority Data
Apr. 26, 2006 (JP) .................................. 2006-122610

(51) Int. Cl.
G09G 3/32 (2006.01)
(52) U.S. Cl. ............................................. 345/83; 345/82
(58) Field of Classification Search .................. 313/498, 313/503, 504, 506; 349/122, 138; 345/82, 345/83, 84, 87, 90, 92
See application file for complete search history.

(56) References Cited

U.S. PATENT DOCUMENTS

| | | | |
|---|---|---|---|
| 6,307,528 B1 * | 10/2001 | Yap | 345/45 |
| 7,095,172 B2 * | 8/2006 | Sakamoto et al. | 313/506 |
| 7,923,919 B2 * | 4/2011 | Okano | 313/504 |
| 2002/0011783 A1 | 1/2002 | Hosokawa | |
| 2003/0146711 A1 | 8/2003 | Tsujimura et al. | |
| 2003/0151355 A1 | 8/2003 | Hosokawa | |
| 2004/0207614 A1 | 10/2004 | Yamashita et al. | |
| 2005/0004631 A1 | 1/2005 | Benedict | |
| 2005/0046341 A1 | 3/2005 | Ikeda et al. | |
| 2005/0077816 A1 | 4/2005 | Yamada et al. | |
| 2005/0248266 A1 | 11/2005 | Hosokawa | |
| 2007/0066128 A1 | 3/2007 | Wu et al. | |
| 2007/0066178 A1 | 3/2007 | Yamada et al. | |
| 2007/0247064 A1 | 10/2007 | Hosokawa | |

FOREIGN PATENT DOCUMENTS

| | | |
|---|---|---|
| EP | 1 191 820 A1 | 3/2002 |
| JP | 2000-323276 A | 11/2000 |
| JP | 2001-035662 A | 2/2001 |

OTHER PUBLICATIONS

Official Communication issued in International Patent Application No. PCT/JP2007/058198, mailed on Jun. 19, 2007.
Blochwitz-Nimoth et al.: "Full Color Active Matrix OLED Displays With High Aperture Ratio," Society for Information Display; SID 04 Digest; 2004, pp. 1000-1003.
"Ekisho Ni Ha Makenai," yuki El ga kudougijyutu de teikosutoka he; Nikkei Microdevices, Feb. 2005, Nikkei BP Corp., p. 77.

* cited by examiner

Primary Examiner — My-Chau T Tran
(74) Attorney, Agent, or Firm — Keating & Bennett, LLP (57) ABSTRACT

An organic electroluminescent display device is capable of flowing a constant electric current into each pixel and improving image qualities even if the device displays an image on a large screen. The organic electroluminescent display device including a lower electrode, an organic electroluminescent film, and an upper electrode on a substrate arranged in this order, wherein the upper electrode is divided in units of a pixel or dot by a partition having an insulating property.

8 Claims, 5 Drawing Sheets

ORGANIC ELECTROLUMINESCENT DISPLAY DEVICE AND PRODUCTION METHOD THEREOF

BACKGROUND OF THE INVENTION

1. Field of the Invention

The present invention relates to an organic electroluminescent display device and a production method thereof. More specifically, the present invention relates to an organic electroluminescent display device preferably used as an active matrix display device and a production method thereof.

2. Description of the Related Art

An organic electroluminescent (hereinafter, also referred to as an EL) display device includes an organic EL element in each pixel or dot. The organic EL element is composed of two opposed electrodes and an organic EL film interposed between these two opposed electrodes.

Figure 7:
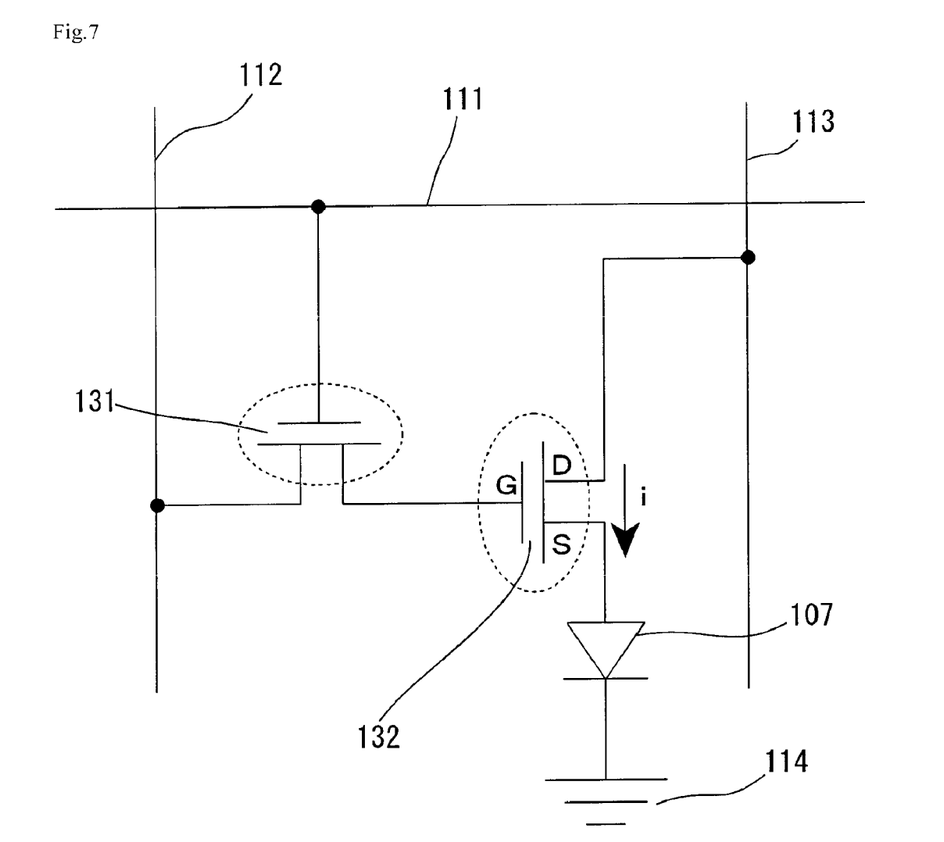
FIG. 7 is a circuit diagram of a conventional organic EL display device.
Figure 8:
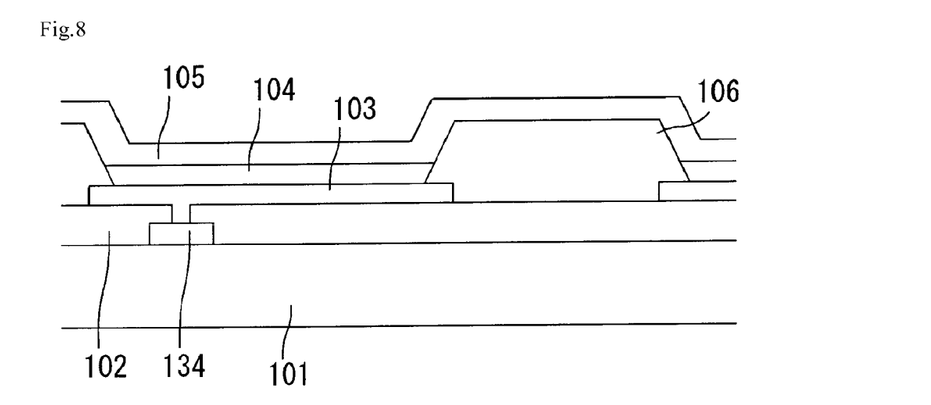
FIG. 8 is a cross-sectional view schematically showing a conventional organic EL display device.

A passive matrix or active matrix system is commonly used as a driving system of the organic EL display device. Particularly in an organic EL display device with a large screen, an active matrix system is preferably used because a response speed is fast and a contrast ratio is excellent (for example, refer to Japanese Kokai Publication No. 2004-246320 and Japanese Kokai Publication No. 2001-35662). As shown in FIGS. 7 and 8, according to the active matrix organic EL display device, a gate line 111 and a source line 112 are arranged to be perpendicular to each other on a substrate 101 and a switching element such as a thin film transistor (hereinafter, also referred to as a TFT) and an organic EL element are arranged in each pixel or dot. A switching TFT 131 and a driving TFT 132 are generally arranged as the switching element, as shown in FIG. 7. An electrode 103 (hereinafter, also referred to as a lower electrode) on the substrate 101 side of two electrodes constituting the organic EL element is connected to the TFT, commonly. Further, a metal film is formed on the entire region to form an electrode 105 (hereinafter, also referred to as an upper electrode), as a common electrode, on the side opposite to the electrode 103 with the organic EL film 104 therebetween. In an example shown in FIG. 7, the lower electrode 103 is an anode and the upper electrode 105 is a cathode. Each TFT controls driving of the organic EL element. An interlayer insulating film 102 is generally formed between the substrate 101 and the lower electrode 103 except for a part needed for wirings. On the interlayer insulating film 102, a bank 106 is formed to surround the organic EL film 104. In FIG. 7, an electric current i flows from a power line 113 in the arrow direction under control of the driving TFT 132, and then flows to an external region 114 through an organic EL light-emitting region 107. In the driving TFT 132, G shows a gate electrode; S shows a source electrode; and D shows a drain electrode.

Such an organic EL display device is excellent in responsiveness and visibility such as contrast ratio and viewing angle. Further, the organic EL display device permits low power consumption, slim profile, light weight, and flexibilization of the display itself. In these points, the organic EL display device is very excellent. Therefore, future market expansion of such an organic EL display device has been expected as a next generation flat display. However, the technology of the organic EL display device is still developing in comparison to a liquid crystal display device or a plasma display device, which is a major display device at present. The organic EL display device still has a room for improvement in image qualities particularly when the device displays an image on a large screen.

By the way, a silicon thin film formed of amorphous silicon and polysilicon may be mentioned as a semiconductor material for a common TFT used in the organic EL display device. The polysilicon has a high field-effect mobility, but it is difficult to form a polysilicon film over a large screen panel in terms of production processes. Therefore, it is possible that amorphous silicon which can be easily formed over a large screen is used to form the panel. However, with regard to the amorphous silicon, only a method of forming an n-channel TFT has been established because of the production processes.

As shown in FIGS. 7 and 8, usually, the lower electrode (anode) 103 of the organic EL element is connected to the source electrode 134 of the driving TFT 132, thereby connecting the organic EL element to the TFT. According to such a connection method, if the resistance of the organic EL film 104 is changed with time, the gate voltage of the driving TFT 132 is changed. Therefore, it might become difficult to drive the organic EL element at a constant electric current. For this problem, a method in which the organic EL element structure is inverted, that is, the organic EL element has a bottom cathode structure in which the cathode is positioned at the bottom (on the substrate side), and then the cathode is connected to an n-channel TFT has been proposed (for example, refer to Jan Blochwitz-Nimoth et al., "Full Color Active Matrix OLED Displays with High Aperture Ratio", "SID Digest of Technical Papers", (U.S.), Society for Information Display, 2004, p. 1000, and ""Ekisho ni ha makenai" yuki EL ga kudougijyutu de teikosutoka he", "Nikkei Micro-device, February issue, 2005", Nikkei BP Corp., p. 77). However, if a polymer is used as a material for the organic EL, a material with a relatively low work function is used as a material for the cathode. Therefore, the cathode material is deteriorated during processes of forming the organic EL film, which inevitably leads to deterioration of the organic EL element. In this point, such a method has room for improvement.

SUMMARY OF THE INVENTION

In order to overcome the problems described above, preferred embodiments of the present invention provide an organic EL display device capable of improving image qualities and a production method thereof.

The present inventor made various investigations of an organic EL display device capable of improving qualities of an image displayed particularly on a large screen. Then, the inventor noted the embodiment of the upper electrode. The inventor found that if the upper electrode is formed over the entire substrate surface as a common electrode as in a conventional method, every pixel on the substrate is connected to each other through the upper electrode, and because of this, a voltage is largely decreased in the pixels positioned at the end portion on the substrate, which might cause uneven display. Further, the inventor found that the decrease in the voltage in the pixels positioned at the end portion can be reduced by dividing the upper electrode in units of a pixel or dot using a partition having an insulating property, and thereby images with higher qualities can be displayed and a configuration that is advantageous for improving an aperture ratio or reducing a parasitic capacitance can be obtained using such a partition. As a result, the above-mentioned problems have been solved, leading to development and completion of preferred embodiments of the present invention.

That is, according to a preferred embodiment of the present invention, an organic electroluminescent display device includes a lower electrode, an organic electroluminescent film, and an upper electrode on a substrate in this order, wherein the upper electrode is divided in units of a pixel or dot by a partition having an insulating property.

An organic EL display device according to a preferred embodiment of the present invention includes a lower electrode, an organic EL film, and an upper electrode on a substrate in this order. The above-mentioned substrate is not especially limited as long as an organic EL element is arranged on it. A glass substrate, a resin substrate, and the like, can be used. On the substrate, basically, a wiring which flows an electric current into the organic EL film in each pixel or dot and which is connected to the lower electrode and/or the upper electrode, a circuit element arranged to control an amount of the electric current, an insulating film (hereinafter, also referred to as an interlayer insulating film) arranged to electrically separate a layer where the wiring is arranged from a layer where the lower electrode is arranged, and the like, is formed. An acrylic photosensitive resin and the like may be used as a material for the insulating film.

With regard to the above-mentioned upper and lower electrodes, one is an anode and the other is a cathode. Further, at least one of the upper and lower electrodes has transparency and transmits light generated in the organic EL film. With regard to a material for the anode, a transparent conductive film such as ITO (indium tin oxide) and IZO (indium zinc oxide) is preferably used in a bottom emission organic EL display device. In a top emission organic EL display device, a stacked body including a transparent conductive film and a metal film such as an aluminum film and a silver film is preferably used. With regard to a material for the cathode, for example, a stacked body including a barium film and an aluminum film is preferably used in a bottom emission organic EL display device. The same material as used in the bottom emission organic EL display device can be used in the top emission organic EL display device. However, such a top emission organic EL display device has a configuration in which emitted light is output from the upper electrode side. Therefore, it is preferable that the upper electrode is formed to have the smallest possible thickness in order to reduce light loss attributed to the upper electrode.

The material for the above-mentioned organic EL film is not especially limited as long as it is an organic material which emits light due to that the molecules are excited by electrons injected from the electrode. It is preferable that the organic EL film is a multi-layer film in order to improve the device characteristics. It is preferable that the organic EL film is a multi-layer film including a positive hole injection/transport layer, an electron injection/transport layer, and a carrier-blocking layer, in addition to the light-emitting layer.

In a preferred embodiment of the present invention, the above-mentioned upper electrode is divided into units of a pixel or dot by a partition having an insulating property. The upper electrodes are electrically separated from each other in units of a pixel or dot, and thereby a power is supplied to each organic EL element individually. As a result, the decrease in voltage in the pixels at the end portion on the substrate can be suppressed, and thereby it becomes easier to drive each organic EL element on the substrate at a constant electric current. The insulating property of the above-mentioned partition is high enough to electrically separate the upper electrodes which are separately formed in units of a pixel or dot from each other and individually control the upper electrodes. The pixel is the minimum unit for drawing in monochrome display or color display. In the color display, a plurality of dots constitutes one pixel. The dot is the minimum unit for driving. The plurality of dots constituting one pixel (generally, dots which display different colors) are individually controlled, and thereby a desired pixel display is performed.

Accordingly, in the monochrome display, one organic EL element is arranged in one pixel. In the color display, three dots of red, green, and blue constitute one pixel. One organic EL element is arranged in each dot. The dot is also referred to as a sub-pixel.

The material for the above-mentioned partition is not especially limited as long as it has an insulating property. A negative photosensitive resin is preferable in order to simplify the production steps. For example, a novolac resin and the like may be used. It can be possible in principle to divide the upper electrode by patterning the upper electrode using a mask. However, misalignment of the mask and a reduction in alignment accuracy due to thermal expansion and/or shrinkage of the mask, are inevitable. Therefore, the partition needs to be used as in various preferred embodiments of the present invention, in order to electrically separate the upper electrodes from each other in units of a pixel or dot.

In a passive driving organic EL display device, a partition which is called cathode separator is arranged to form the cathode into a stripe pattern, in some cases. However, the partition in the organic EL display device of a preferred embodiment of the present invention is formed to separate the upper electrodes in units of a pixel or dot. Therefore, these two partitions are different in both of the configuration and the function.

The configuration of the organic EL display device of the present invention is not especially limited as long as it essentially has these components. Other components are not especially limited.

Preferred embodiments of the organic EL display device of the present invention are described below in more detail.

It is preferable that the partition has an overhang shape. In the present description, the overhang shape is not especially limited as long as it is the following shape: when the substrate side is a bottom portion and the opposite side is an upper portion, the bottom portion is smaller than the upper portion. An inverted tapered shape may be mentioned as such a shape. That is, the width of the partition is decreased toward the bottom portion. If the partition has an overhang shape, a connection between the conductive film formed on the partition and the conductive film (upper electrode) formed on the organic EL film can be prevented when the partition is formed and then the conductive film is formed over the entire substrate surface. Therefore, it can be easily secured to electrically separate the upper electrodes from each other in units of a pixel or dot. Such a partition can be formed by a photolithography method.

It is preferable that a conductive film is formed on an upper surface of the partition (hereinafter, also referred to as the first preferred embodiment of the present invention). If the conductive film is formed on the partition, a region on the partition can be used as a position where wirings or electrodes are arranged. For example, if the conductive film on the partition is used as a bus line, a position where the bus line is arranged, which is conventionally needed, is omitted, and the region on the substrate can be effectively used. As a result, the aperture ratio can be improved. Further, a parasitic capacitance can be reduced if wirings or electrodes are formed on the partition having an insulating property. Further, the conductive film on the partition can be formed together with the upper electrode by forming the conductive film over the entire substrate surface by a deposition method and the like after the partition is formed. Therefore, no special formation steps are needed for forming the conductive film. Accordingly, the same material as that for the upper electrode is preferably used for the conductive film.

According to the first preferred embodiment of the present invention, it is preferable that the partition has a contact hole. According to this, the conductive film on the partition can be electrically connected to wirings or electrodes positioned on the lower-layer side than the partition. Therefore, the conductive film on the partition can be effectively used. In the present description, the contact hole means a through-hole formed in the partition. In the contact hole, a conductive material is usually formed. The contact hole may be a cylindrical hole or a groove formed along the extension direction of the partition. It is preferable that the contact hole has a tapered shape, i.e., the width of the contact hole is decreased toward the substrate side, in order to secure the electrical connection more surely. It is preferable that the contact hole has a smooth surface in order to prevent insulation from being generated inside the contact hole due to disconnection caused by step. The contact hole can be simultaneously prepared when the partition is patterned.

According to the first preferred embodiment of the present invention, a method of arranging photomasks having different transmissive patterns with the substrate therebetween and exposing the both sides of the substrate is preferably used as a method of forming the partition if the contact hole is formed in the partition. That is, a preferred embodiment of the present invention is a production method of the organic electroluminescent display device according to another preferred embodiment of the present invention in accordance with the preferred embodiment in which a conductive film is formed on an upper surface of a partition and a contact hole is formed in the partition, wherein a photosensitive resin film is exposed through photomasks having different transmissive patterns from both sides of the substrate, and the photosensitive resin film is developed, thereby forming a partition having an opening (hereinafter, also referred to as the first method of forming the partition).

According to the first method of forming the partition in a preferred embodiment of the present invention, the outer wall of the partition is patterned by the exposure from the upper surface side (on the partition-formed surface side) of the substrate, and the inner wall (the contact hole side) of the partition is patterned by the exposure from the lower surface side of the substrate. If a negative photosensitive resin film is exposed, the outer wall of the partition has an overhang shape and the contact hole tapers toward the substrate side (refer to FIGS. 5A and 5B).

In the case where the substrate is exposed from one surface side, the partition can be formed in the following manner if the conductive film is formed on the upper surface of the partition and the contact hole is formed in the partition. A negative photosensitive resin film is patterned to form outer walls of the partition having an overhang shape, and further a positive photosensitive resin is applied to form inner walls (the contact hole side) of the partition in such a way that the formed contact hole tapers toward the substrate side. That is, a preferred embodiment of the present invention provides a production method of the organic electroluminescent display device according to a preferred embodiment of the present invention in accordance with the preferred embodiment in which a conductive film is formed on an upper surface of a partition and a contact hole is formed in the partition, wherein the production method includes the steps of: forming the first opening and an outer wall portion of the partition by exposing and developing a negative photosensitive resin film; forming a positive photosensitive resin film on the outer wall portion of the partition and inside the first opening; and forming the second opening and an inner wall portion of the partition by exposing and developing the positive photosensitive resin film (hereinafter, also referred to as the second method of forming the partition).

According to the second method of forming the partition according to a preferred embodiment of the present invention, the outer wall portion having an overhang shape of the partition is formed first, using a negative photosensitive resin. In this case, the first opening having a forward tapered shape is formed in the outer wall portion of the partition. Then, a positive photosensitive resin film is formed on the outer wall of the partition and inside the first opening. Usually, the positive photosensitive resin is applied over the entire substrate surface including the region on the outer wall portion of the partition and inside the first opening. Then, the positive photosensitive resin film is patterned, thereby forming the inner wall portion having a forward tapered shape of the partition on the outer wall portion of the partition and the inside thereof (refer to FIGS. 6A-6D). In this case, the second opening having an overhang shape is formed in the inner wall portion of the partition. Then, a conductive material is formed inside the second opening, thereby forming a contact hole. According to the second method of forming the partition according to a preferred embodiment of the present invention, the partition having an overhang shape, which has a contact hole whose width is decreased toward the substrate side (having a tapered shape) is preferably formed.

It is preferable that the organic electroluminescent display device further includes an n-channel thin film transistor, and the upper electrode is connected to a drain electrode of the n-channel thin film transistor (hereinafter, also referred to as the second embodiment of the present invention). If the TFT is an n-channel TFT, amorphous silicon can be used because it is more suitably used than polysilicon in terms of production processes when the device has a large screen. That is, according to the second preferred embodiment of the present invention, amorphous silicon is preferable as a semiconductor material for the n-channel TFT. If the TFT is an n-channel TFT, a reduction in qualities of images displayed by the organic EL display device might be generated due to deterioration with time of the organic EL film when the anode of the organic EL element is connected to the source electrode. Accordingly, a configuration in which the cathode of the organic EL element is connected to the source electrode of the TFT is preferable and a bottom anode structure in which the lower electrode is an anode is particularly preferable according to the second preferred embodiment of the present invention. According to the bottom anode structure, the cathode is not so deteriorated during the production processes in comparison to the bottom cathode structure. Therefore, a material with a low work function such as barium and calcium can be used as the cathode. Therefore, such a bottom anode structure is suitable for a polymer organic EL element. That is, if a polymer organic EL material is used, the bottom anode structure is suitable in order to form a structure in which the cathode of the organic EL element is connected to the drain electrode of the n-channel thin film transistor and sufficiently obtain the above-mentioned effects attributed to the second embodiment of the present invention. Accordingly, it is preferable that the organic EL film is made of a polymer material and that the upper electrode is a cathode made of a material having a low work function such as barium and calcium according to the second preferred embodiment of the present invention. In addition, the above-mentioned partition is formed and the upper electrodes are formed to be separated from each other in every organic EL element, in a preferred embodiment of the present invention. Therefore, driving problems are not generated even if the upper electrode is connected to the drain electrode of the n-channel TFT.

As mentioned above, if the lower electrode is connected to the source electrode of the TFT, the organic EL element might not be driven at a constant electric current when the resistance of the organic EL film is changed with time. In contrast, according to the second preferred embodiment of the present invention, the upper electrode is connected to the drain electrode of the n-channel TFT. Therefore, the organic EL light-emitting region is arranged on the upstream side of the TFT, and therefore influences by the change with time in the resistance of the organic EL film are less. Accordingly, the organic EL light-emitting region can be driven at a constant current regardless of change with time in the resistance of the organic EL film. In the present description, the drain electrode of the n-channel TFT is an electrode from which many carriers flow and the source electrode is an electrode into which many carriers flow. The drain electrode has a higher voltage.

According to the second preferred embodiment of the present invention, it is preferable that a conductive film connected to a source electrode of the n-channel thin film transistor is formed on an upper surface of the partition. In the present invention, such a preferred embodiment in which the first preferred embodiment is combined with the second preferred embodiment is particularly preferable. For example, if a contact hole is formed also in the bank formed below the partition to be coupled to the contact hole formed in the partition, the conductive film on the partition can be connected to the source electrode of the TFT. Therefore, the conductive film on the partition can be used as a bus line, and additionally, the second preferred embodiment of the present invention is realized. That is, there is no need to form a plurality of wirings having different functions in the same level, and the plurality of wirings can be formed in different levels. Therefore, the aperture ratio can be improved and the parasitic capacitance at the intersections of the wirings can be reduced. Further, the reduction in parasitic capacitance leads to an improvement in display uniformity and a reduction in wiring delay. Further, according to the present preferred embodiment, the wirings connected to the source electrode can be formed in a lattice pattern without a reduction in aperture ratio. Therefore, the resistance of the wiring can be reduced and redundancy of the wiring can be improved (an alternative electrical path can be secured even if an electric discontinuity is generated).

A preferred embodiment of the present invention provides a production method of the organic electroluminescent display device in accordance with the second preferred embodiment, wherein a liquid material is selectively applied, thereby forming an organic electroluminescent film (hereinafter, also referred to as a production method of the organic EL display device according to a preferred embodiment of the present invention). If the conductive film on the partition is connected to the source electrode of the n-channel TFT or the upper electrode is connected to the drain electrode of the TFT, in order to connect them to each other, the bank below the partition and the like needs to have a contact hole. However, if the organic EL film is formed by a deposition method and the like, the contact hole might be filled with the material for the organic EL film when the organic film is formed. According to the production method of the organic EL display device of a preferred embodiment of the present invention, the liquid material for the organic EL film is selectively applied, which can prevent the organic EL layer from filling the contact hole. Examples of a method of selectively applying the liquid material include an ink-jet method, a nozzle printing method, a photogravure printing method, a screen printing method, a spray method, and a spin coat method. Among these, an ink-jet method is preferably used.

In order to enhance the above-mentioned selectivity, it is preferable that the bank surface is provided with a property of shedding the liquid material (hydrophobic property) and the lower electrode surface is provided with a property of showing affinity for the liquid material (hydrophilic property). According to this, even if a droplet of the liquid material injected from the ink-jet nozzle is dropped on the bank, the liquid material flows on the lower electrode surface. As a result, the organic EL layer can be effectively prevented from filling the contact hole. The hydrophilicity of the lower electrode can be provided with a UV-ozone treatment or an oxygen plasma treatment, for example. The hydrophobicity of the bank can be provided with a plasma treatment using fluorine gas such as carbon tetrafluoride.

According to the organic EL display device of a preferred embodiment of the present invention, the respective pixels or dots are electrically separated from each other by the partition. Therefore, the reduction in voltage in the pixels at the end part on the substrate can be prevented. As a result, it becomes easier to flow a constant electric current into the organic EL elements in the substrate plane, and thereby image qualities can be improved. In addition, the conductive film is formed on the partition and connected to the source electrode of the driving TFT. Thereby, a wiring for connecting the source electrode to the external part needs not to be additionally formed. As a result, a parasitic capacitance generated at the intersections of the wirings can be reduced and the aperture ratio can be improved. Further, the reduction in the parasitic capacitance leads to an improvement in the display uniformity and a reduction in the wiring delay. In addition, the aperture ratio can be improved, and simultaneously, the wiring resistance can be reduced and the wiring redundancy can be improved.

If an n-channel TFT including amorphous silicon is used, the drain electrode of the TFT is connected to the upper electrode, and thereby the organic EL display device is driven at a constant electric current regardless of the change with time in the resistance of the organic EL film. As a result, qualities of an image displayed on a large screen can be improved.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIGS. 4A-4E are cross-sectional views schematically showing the production steps of the organic EL display device prepared in Preferred Embodiment 1, wherein

FIGS. 5A and 5B are cross-sectional views schematically showing the production steps (the first method of forming the partition) of the organic EL display device prepared in Preferred Embodiment 1, wherein

FIGS. 6A-6D are cross-sectional views schematically showing the production steps (the second method of forming the partition) of the organic EL display device prepared in Preferred Embodiment 2, wherein

DETAILED DESCRIPTION OF THE PREFERRED EMBODIMENTS

The present invention is mentioned in more detail below with reference to preferred embodiments using drawings, but not limited to only these preferred embodiments.

An organic EL display device prepared in Preferred Embodiment 1 preferably includes a partition on a bank surrounding an organic EL film; and an n-channel TFT.

Figure 1:
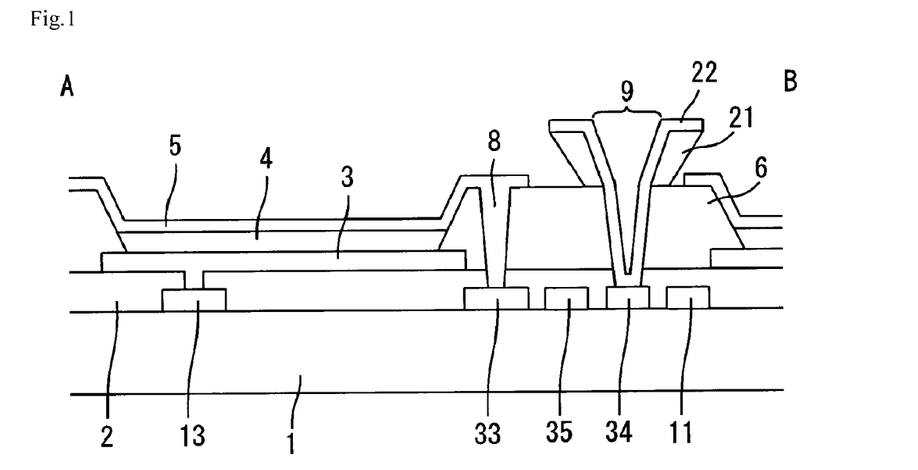
FIG. 1 is a schematic view of an organic EL display device prepared in Preferred Embodiment 1 and shows a cross-section taken along line A-B in FIG. 3.
Figure 3:
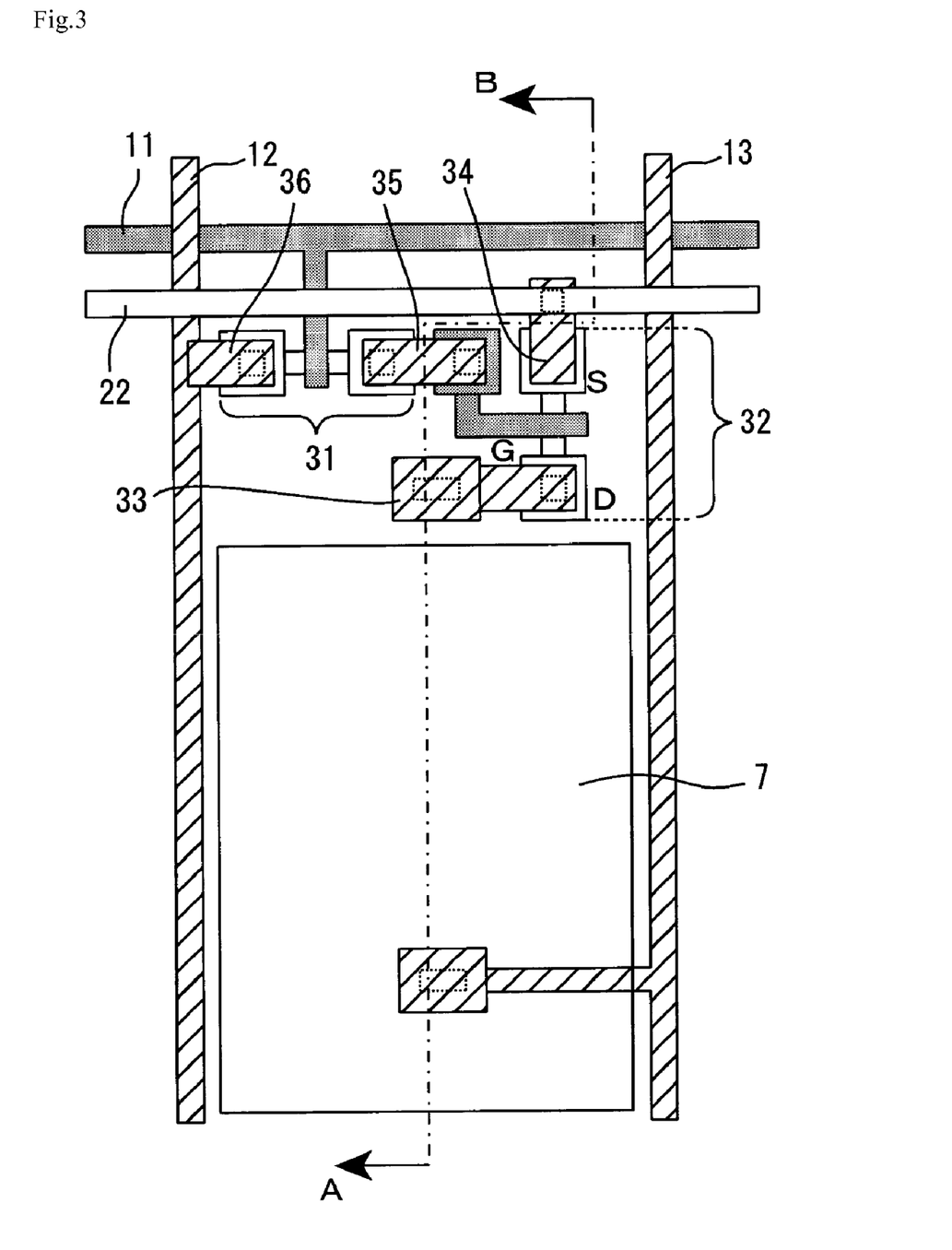
FIG. 3 is a planar view schematically showing a circuit configuration of the organic EL display device prepared in Preferred Embodiment 1.

FIG. 1 is a schematic view of an organic EL display device prepared in Preferred Embodiment 1 and shows a cross-section taken along line A-B in FIG. 3.

According to the organic EL display device prepared in Preferred Embodiment 1, a source line, a gate line 11, a power supply line 13, a drain electrode 35 and a source electrode 36 of a switching TFT, a drain electrode 33 and a source electrode 34 of a driving TFT, and the like, are arranged on a substrate 1. Thereon, an interlayer insulating film 2, an anode (lower electrode) 3 of an organic EL element, an organic EL film 4, and a cathode (upper electrode) 5 of the organic EL element are stacked in this order. Further, a bank 6 is arranged to surround the organic EL film 4. An insulating partition 21 having an inverted tapered shape is arranged on the bank 6. This partition 21 divides the cathode (upper electrode) 5 in units of a pixel or dot. Further, the drain electrode 33 of the driving TFT is connected to the cathode 5 of the organic EL element through the first contact hole 8 formed in the bank 6. The source electrode 34 of the driving TFT is connected to the conductive film 22 formed on the partition through the second contact hole 9.

Figure 2:
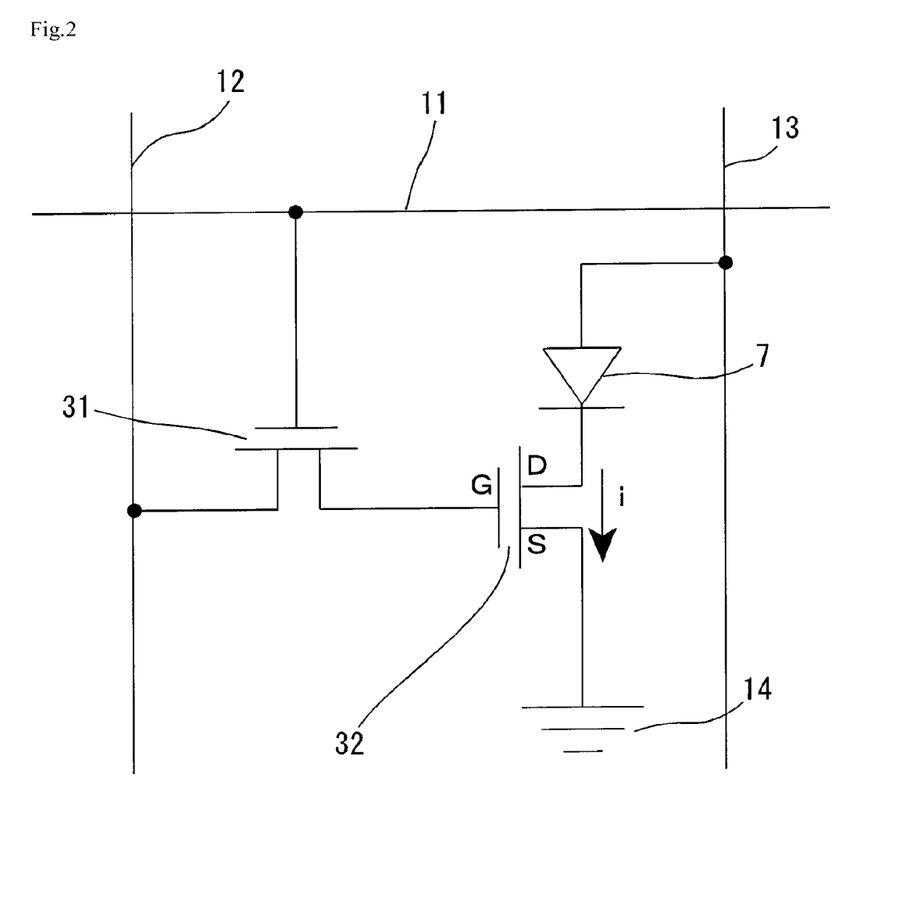
FIG. 2 is a circuit diagram of the organic EL display device prepared in Preferred Embodiment 1.

FIG. 2 is a circuit diagram of the organic El display device prepared in Preferred Embodiment 1.

The organic EL display device prepared in Preferred Embodiment 1 is driven in accordance with an active matrix system. On the substrate, the gate line 11 is arranged to be perpendicular to the source line 12, and the organic EL element in arranged in each pixel or dot. The power supply line 13 for organic EL emission is individually arranged and it is arranged in an organic EL light-emitting region 7. Each pixel or dot includes at least two switches. One is a switching TFT 31 for controlling emission of light in each pixel or dot. The other is a driving TFT 32 for controlling a voltage from the power supply line 13. An electric current flows into a gate electrode G of the driving TFT 32 when the switching TFT 31 receives a switch signal. Once the electric current flows into the gate electrode G of the driving TFT 32, an electric current i flows from the power supply line 13 into the organic EL light-emitting region 7 in the arrow direction in FIG. 2. The drain electrode D of the driving TFT 32 is connected to the organic EL light-emitting region 7. A source electrode S of the driving TFT 32 is connected to a non-display region 14 through the conductive film 22 on the partition. The pixel circuit in Preferred Embodiment 1 has a configuration in which two TFTs, i.e., the switching TFT 31 and the driving TFT 32, are arranged. However, it is preferable that three or more TFTs or a capacitance is arranged in order to handle a variation and change with time in TFT characteristics such as a threshold or a mobility.

FIG. 3 is a planar view schematically showing a circuit configuration of the organic EL display device prepared in Preferred Embodiment 1.

As shown in FIG. 3, the switching TFT 31, the gate electrode G of the driving TFT 32, and the gate line 11 may be made of the same electrode material. As such an electrode material, metals with a high melting point such as tantalum and tungsten or compounds thereof may be used. The drain electrode 35 and the source electrode 36 of the switching TFT 31, the drain electrode 33 and the source electrode 34 of the driving TFT 32, the source wiring 12, and the power supply line 13 may be made of the same electrode material. As such an electrode material, metals with a low resistance such as aluminum or compounds thereof, or a stacked film including these metals or compounds, may be used. As an electrode material for the conductive film 22 on the partition, which is connected to the source electrode 34, a stacked film including a barium film and an aluminum film is used. In Embodiment 1, amorphous silicon is suitably used as a silicon material for the switching TFT 31 and the driving TFT 32 in using the amorphous silicon for a large screen. In FIG. 3, regions surrounded by the dotted line each show a contact hole.

The organic EL display device in Preferred Embodiment 1 is prepared in a production flow shown in FIGS. 4A-4E, for example.

Figure 4A:
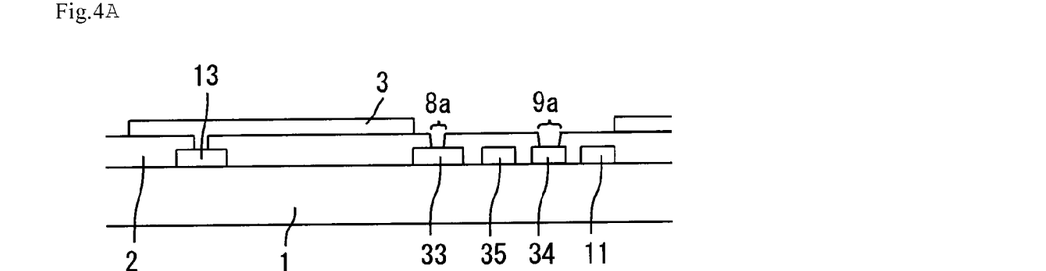
FIG. 4A shows a state where the anode has been prepared.

First, as shown in FIG. 4A, the source electrode and the drain electrode 35 of the switching TFT 31, the source electrode 34 and the drain electrode 33 of the driving TFT 32, the gate line 11, the source line 12, and the power supply line 13 are arranged on the substrate 1. Then, the first contact hole 8a and the second contact hole 9a are arranged and simultaneously the interlayer insulating film 2 is stacked over the substrate. Then, the anode 3 is arranged to be connected to the power supply line 13.

Figure 4B:
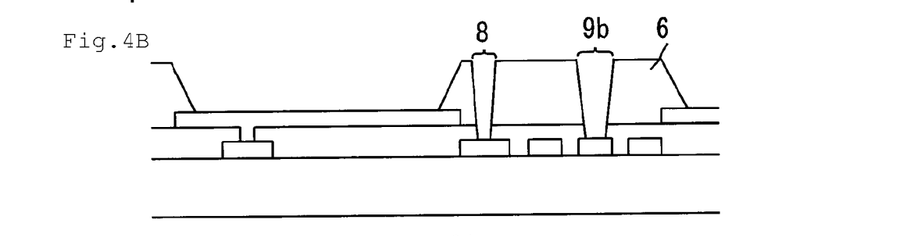
FIG. 4B shows a state in which the bank has been further prepared.

Then, the bank 6 is formed as shown in FIG. 4B. The bank 6 has a function of keeping a liquid droplet when an ink containing a polymer material is applied. Similarly to the interlayer insulating film 2, it is preferable that the bank 6 has the first contact hole 8 for connecting the cathode 5 to the source electrode 34 of the driving TFT and the second contact hole 9b for connecting the conductive film 22 on the partition to the drain electrode 33 of the driving TFT. It is preferable that each of the first contact hole 8 and the second contact hole 9b has a smooth shape in order to secure the electrical connection. In this case, the inclined surface preferably has a taper angle of 45° or less, and more preferably a taper angle of 30° or less. It is preferable that a photosensitive resin is used as a material for the bank 6 because the processes can be simplified. A polyimide resin, an acrylic resin and a novolac resin may be used as the resin. The following method may be mentioned as a method of forming the bank 6, for example. A liquid resin material is applied by a method such as a spin coater or a slit coater. Then, the applied resin is etched into a specific pattern through a series of photolitho-process including: prebaking at 120° C. for 3 minutes; exposure at a total exposure of 100 mJ/cm$^2$; and paddle development for 2 minutes using 2.38 wt % of TMAH aqueous solution; and post baking at 220° C. for 1 hour. In this case, the bank preferably has a thickness of about 1 μm to about 5 μm and more preferably about 2 μm to about 4 μm, for example.

Figure 4C:
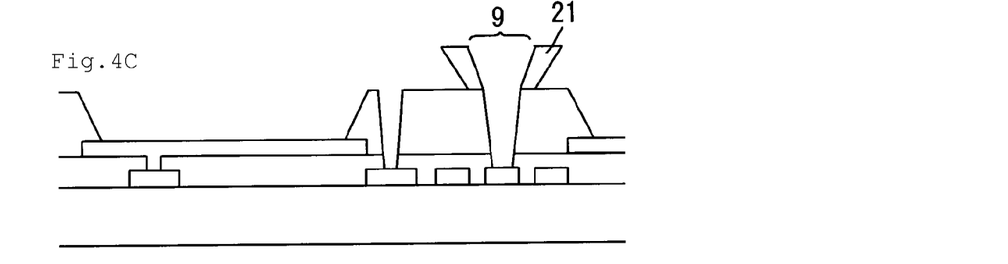
FIG. 4C shows a state in which the partition has been further prepared.

As shown in FIG. 4C, the partition 21 is formed. The partition 21 is needed for electrically partitioning the cathode in units of a pixel or dot. It is preferable that the partition 21 is formed to have a through-hole in such a way that the through-hole is coupled to the second contact hole 9b previously formed in the bank 6 to form the second contact hole 9. As a result, a metal film 22 which is formed on the partition later can be connected to the source electrode 34 of the driving TFT 32.

Figure 5A:
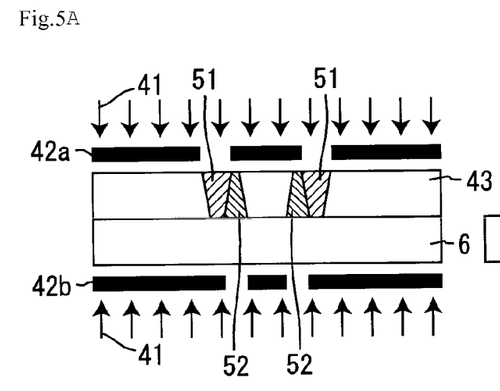
FIG. 5A shows a state when the both sides of the substrate is irradiated with light.
Figure 5B:
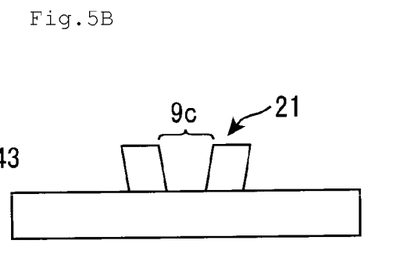
FIG. 5B shows a state when the partition is formed by patterning through exposure and development.

In Preferred Embodiment 1, the partition 21 is prepared by the first method of forming the partition. That is, as shown in FIGS. 5A and 5B, a negative photosensitive resin 43 is applied on the bank 6, and two photomasks 42a and 42b having different patterns are arranged on both sides of the substrate, respectively. Then, the substrate is irradiated with UV 41 from the both sides. In such manners, the partition 21 can be formed. Specifically, as shown in FIG. 5A, the photomask 42a having two openings and the photomask 42b having two openings are appropriately arranged in such a way that light which passes through the openings of the upper photomask 42a forms an outer wall of the partition 21 and light which passes through the openings of the lower photomask 42b forms an inner wall of the partition 21. If the substrate is irradiated with the UV 41 under such a condition, the UV 41 which is transmitted through the upper photomask 42a and the UV 41 which is transmitted through the lower photomask 42b are each radiated in an opposite direction in a tapered shape. Then, the development step is performed, thereby patterning the resist into a shape which the UV 41-irradiated regions 51 and 52 have. Thus, the outer wall of the partition 21 can be patterned from the upper side of the substrate and the inner wall (the contact hole side) of the partition 21 can be patterned from the lower side of the substrate.

As a result, as shown in FIG. 5B, the partition 21 having an overhang shape is formed to have the second hole 9c at the center thereof. When the above-mentioned patterning is performed, the opening of the partition 21 needs to be connected with the second contact hole 9b formed on the bank 6.

Figure 4D:
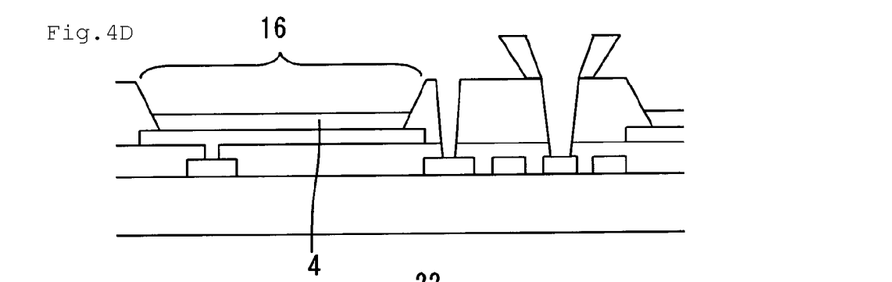
FIG. 4D shows a state in which the cathode has been further prepared.

Successively, the organic EL film 4 is formed, as shown in FIG. 4D. If a polymer organic EL material is used as a material for the organic EL film, a method of selectively coating a specific region, particularly an ink-jet method is preferably used. The ink material is applied on an opening 16 of the bank 6, and the applied ink is subjected to a drying or baking step, thereby forming an organic EL film 4. It is preferable that the bank 6 has a surface with a property of shedding the coating liquid (hydrophobicity) and the anode 3 has a surface with a property of showing affinity for the coating liquid (hydrophilicity). As a result, the patterning can be performed with accuracy even if a liquid droplet injected from an ink-jet nozzle is dropped on the surface of the opening 16 in the bank 6. The hydrophilicity can be provided by an UV-ozone treatment or an oxygen plasma treatment. The hydrophobicity can be provided by a plasma treatment using a fluorine gas such as carbon tetrafluoride. The organic EL film 4 can be formed through a drying step at a temperature of 100° C. or less (if necessary, under reduced pressure), and a baking step at a temperature of 150 to 200° C., after the material for the organic EL film is applied. It is preferable that the organic EL film 4 is a multi-layer film in order to improve the device characteristics. In addition to the light-emitting layer, a positive hole injection/transport layer, an electron injection/transport layer, a carrier blocking layer, and the like preferably constitute the multi-layer film. It is preferable that each film has a thickness of about 50 μm to about 100 nm. Examples of the positive hole injection/transport material include PEDOT-PSS (polyethylene dioxythiophene polystyrene sulfonic acid), and polyaniline. Examples of the light-emitting material include polyfluorene derivatives such as poly-dioctylfluorene, spiro-polyfluorene derivatives, and poly-p-phenylene vinylene derivatives.

Figure 4E:
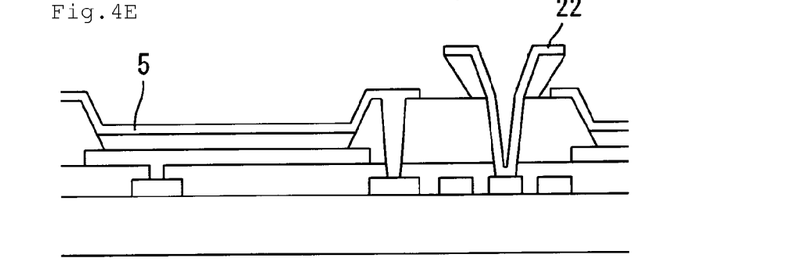
FIG. 4E shows a state in which the cathode is formed on the organic film.

Then, the cathode 5 is formed on the organic film 4, as shown in FIG. 4E. A stacked film including a barium film and an aluminum film may be used as a material for the cathode 5 if a bottom-emission type organic EL display device is prepared. In this case, the barium film has a thickness of about 5 mm and the aluminum film has a thickness of about 100 nm. If a top-emission type organic EL display device is prepared, emitted light is output from the cathode 5 side. Therefore, the transmittance needs to be secured in order to reduce light loss attributed to the cathode 5. It preferable that the cathode 5 has a smaller thickness if the stacked film consisting of a barium film and an aluminum film is used. For example, the cathode 5 has a thickness of 10 nm or less. A transparent conductive material may be used as the material for the cathode 5.

A conductive film 22 is formed on the partition 21. A material for this conductive film 22 may be appropriately changed depending on an intended use. The conductive film may be formed together with the cathode 5 if they have the same configuration. In this case, there is no need to increase the production steps because the partition 21 divides the respective cathodes 5 and conductive films 22 on the partition 21, and thereby each metal film is formed, even if the metal film is formed over the entire surface.

Finally, a sealing is perform to block atmosphere. As a result, the organic EL element is completed.

According to the thus-prepared organic EL display element, the cathode 5 is isolated in units of a pixel or dot. Therefore, the organic El display element has an advantage that a reduction in voltage in the cathode 5 can be reduced in comparison to the case where the cathode 5 is formed on the entire substrate surface as a common electrode. In addition, the conductive film 22 is formed on the partition 21 and connected to the source electrode 34 of the driving TFT through the contact hole 9. The conductive film 22 on the partition serves as a wiring which extracts the source electrode 34 of the driving TFT 32 to the non-display region. As a result, the aperture ratio can be improved and the parasitic capacitance can be reduced.

Preferred Embodiment 2

Preferred Embodiment 2 is preferably substantially the same as Preferred Embodiment 1, except that the partition 21 is produced in a different method.

In Preferred Embodiment 2, the partition 21 is prepared by the second method of forming the partition. FIGS. 6A-6D shows a production flow of the partition 21 in Preferred Embodiment 2.

Figure 6A:
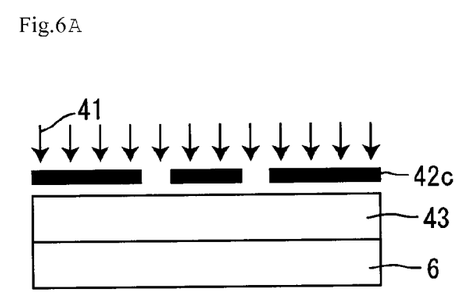
FIG. 6A shows a state in which the negative photosensitive resin has been applied.
Figure 6B:
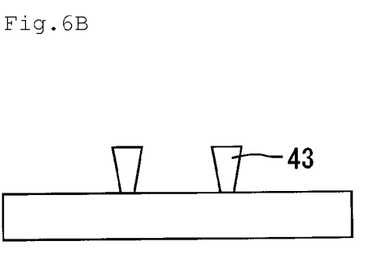
FIG. 6B shows a state in which the applied resin has been patterned by exposure and development.

First, the negative photosensitive resin 43 is applied on the bank 6, as shown in FIG. 6A. Then, a photomask 42c having two openings is appropriately positioned and the entire substrate surface is irradiated with the UV 41 from the negative photosensitive resin 43 side in such a way that an outer wall of the partition 21 is formed by light which passes through the openings of the photomask 42c. As a result, similarly in Preferred Embodiment 1, the UV 41 is radiated in an opposed direction in a tapered shape, and as shown in FIG. 6B, the resist 43 is patterned into a shape the UV 41-irradiated region has, in the development step.

Figure 6C:
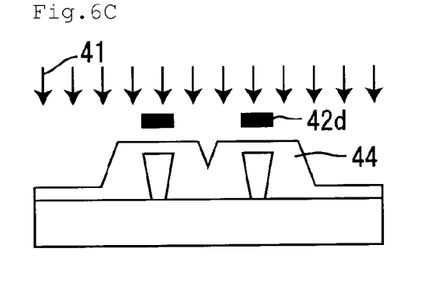
FIG. 6C shows a state in which the positive photosensitive resin has been applied.

Then, as shown in FIG. 6C, a positive photosensitive resin is applied. Then, a photomask 42d having one opening is appropriately positioned and the entire substrate is irradiated with the UV 41 from the positive photosensitive resin 44 side in such a way that light which passes through the opening of the photomask 42d forms an inner wall of the partition 21. As a result, similarly in the above-mentioned manner, the UV 41 is radiated in an opposed direction in a tapered shape. In this step, the positive photosensitive resin 44 is used, and therefore, the resist is patterned into a shape the region which is not irradiated with the UV 41 has, in the development step. As a result, the inner wall (the contact hole side) of the partition 21 is formed.

Figure 6D:
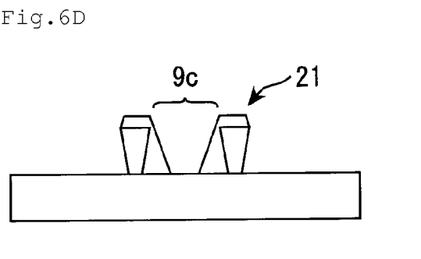
FIG. 6D shows a state in which the applied resin has been patterned by exposure and development.

As a result, as shown in FIG. 6D, the partition 21 having an overhang shape is formed to have the second contact hole 9c at the center thereof. When the above-mentioned patterning is performed, the opening of the partition 21 needs to be connected to the second contact hole 9b formed on the bank 6.

The present application claims priority under the Paris Convention and the domestic law in the country to be entered into national phase on Patent Application No. 2006-218916 filed in Japan on Apr. 26, 2006, the entire contents of which are hereby incorporated by reference.

In the present description, the terms "or more" and "or less" mean that the value described (boundary value) is included.

While preferred embodiments of the present invention have been described above, it is to be understood that variations and modifications will be apparent to those skilled in the art without departing the scope and spirit of the present invention. The scope of the present invention, therefore, is to be determined solely by the following claims.

The invention claimed is:

1. An organic electroluminescent display device comprising:
   a lower electrode;
   an organic electroluminescent film; and
   an upper electrode on a substrate; wherein
   the lower electrode, the organic electroluminescent film, and the upper electrode are arranged in this order;
   the upper electrode is divided in units of a pixel or dot by a partition having an insulating property; and
   the lower electrode is divided in units of a pixel or dot by a bank having an insulating property.

2. An organic electroluminescent display device comprising:
   a lower electrode;
   an organic electroluminescent film; and
   an upper electrode on a substrate; wherein
   the lower electrode, the organic electroluminescent film, and the upper electrode are arranged in this order;
   the upper electrode is divided in units of a pixel or dot by a partition having an insulating property; and
   the partition has an overhang shape.

3. An organic electroluminescent display device comprising:
   a lower electrode;
   an organic electroluminescent film; and
   an upper electrode on a substrate; wherein
   the lower electrode, the organic electroluminescent film, and the upper electrode are arranged in this order; and
   the upper electrode is divided in units of a pixel or dot by a partition having an insulating property;
   a conductive film is arranged on an upper surface of the partition; and
   the partition has a contact hole.

4. A production method of the organic electroluminescent display device comprising a lower electrode, an organic electroluminescent film, and an upper electrode on a substrate in this order; and further comprising a partition, and a conductive film being arranged on an upper surface of the partition; the upper electrode being divided into units of a pixel or dot by the partition, the partition having an insulating property, the production method comprising the steps of:
   exposing a photosensitive resin film through photomasks having different transmissive patterns from both sides of the substrate, and
   developing the photosensitive resin film, thereby forming the partition with an opening which is arranged to serve as a contact hole.

5. A production method of the organic electroluminescent display device of claim 3, comprising the steps of:
   forming a first opening and an outer wall portion of the partition by exposing and developing a negative photosensitive resin film;
   forming a positive photosensitive resin film on the outer wall portion of the partition and inside the opening; and
   forming a second opening and an inner wall portion of the partition by exposing and developing the positive photosensitive resin film.

6. An organic electroluminescent display device comprising:
   a lower electrode;
   an organic electroluminescent film;
   an upper electrode on a substrate; and
   an n-channel thin film transistor; wherein
   the lower electrode, the organic electroluminescent film, and the upper electrode are arranged in this order;
   the upper electrode is divided in units of a pixel or dot by a partition having an insulating property; and
   the upper electrode is connected to a drain electrode of the n-channel thin film transistor.

7. The organic electroluminescent display device according to claim 6, wherein a conductive film connected to a source electrode of the n-channel thin film transistor is disposed on an upper surface of the partition.

8. A production method of the organic electroluminescent display device of claim 6, wherein a liquid material is selectively applied, thereby forming an organic electroluminescent film.

* * * * *